United States Patent
Nishiguchi et al.

(10) Patent No.: US 8,435,866 B2
(45) Date of Patent: May 7, 2013

(54) METHOD FOR MANUFACTURING SILICON CARBIDE SUBSTRATE

(75) Inventors: Taro Nishiguchi, Itami (JP); Makoto Sasaki, Itami (JP); Shin Harada, Osaka (JP); Kyoko Okita, Itami (JP); Hiroki Inoue, Itami (JP); Shinsuke Fujiwara, Itami (JP); Yasuo Namikawa, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/256,991

(22) PCT Filed: Sep. 28, 2010

(86) PCT No.: PCT/JP2010/066828
§ 371 (c)(1),
(2), (4) Date: Sep. 16, 2011

(87) PCT Pub. No.: WO2011/096109
PCT Pub. Date: Aug. 11, 2011

(65) Prior Publication Data
US 2012/0009761 A1    Jan. 12, 2012

(30) Foreign Application Priority Data

Feb. 5, 2010   (JP) .................................. 2010-024508

(51) Int. Cl.
*H01L 21/306* (2006.01)
*H01L 21/304* (2006.01)

(52) U.S. Cl.
USPC .......................................... 438/458; 438/455

(58) Field of Classification Search .................. 438/455, 438/458, 459, 460, 931
See application file for complete search history.

(56) References Cited

U.S. PATENT DOCUMENTS

| | | | |
|---|---|---|---|
| 6,153,166 A | 11/2000 | Tanino | |
| 6,562,127 B1 * | 5/2003 | Kud et al. | 117/94 |
| 6,734,461 B1 * | 5/2004 | Shiomi et al. | 257/77 |
| 6,995,036 B2 * | 2/2006 | Nishino et al. | 438/105 |
| 7,314,520 B2 | 1/2008 | Powell et al. | |
| 2002/0069818 A1 * | 6/2002 | Naito et al. | 117/109 |
| 2002/0083891 A1 * | 7/2002 | Vodakov et al. | 117/104 |
| 2005/0166833 A1 * | 8/2005 | Norikane et al. | 117/81 |
| 2005/0269671 A1 * | 12/2005 | Faure et al. | 257/618 |
| 2007/0221119 A1 | 9/2007 | Kimoto et al. | |
| 2009/0011598 A1 * | 1/2009 | Nagaya et al. | 438/692 |
| 2010/0062546 A1 * | 3/2010 | Endo et al. | 438/5 |
| 2010/0080956 A1 * | 4/2010 | Fujimoto et al. | 428/141 |

FOREIGN PATENT DOCUMENTS

| | | |
|---|---|---|
| JP | 11-12100 | 1/1999 |
| JP | 2005-324994 | 11/2005 |
| JP | 2008-230944 | 10/2008 |
| JP | 2008-290898 | 12/2008 |

* cited by examiner

*Primary Examiner* — Kimberly Rizkallah
*Assistant Examiner* — Mounir Amer
(74) *Attorney, Agent, or Firm* — Drinker Biddle & Reath LLP

(57) ABSTRACT

At least one single crystal substrate, each having a backside surface and made of silicon carbide, and a supporting portion having a main surface and made of silicon carbide, are prepared. In this preparing step, at least one of the backside surface and main surface is formed by machining. By this forming step, a surface layer having distortion in the crystal structure is formed on at least one of the backside surface and main surface. The surface layer is removed at least partially. Following this removing step, the backside surface and main surface are connected to each other.

14 Claims, 9 Drawing Sheets

METHOD FOR MANUFACTURING SILICON CARBIDE SUBSTRATE

TECHNICAL FIELD

The present invention relates to a method for manufacturing a silicon carbide substrate.

BACKGROUND ART

An SiC (silicon carbide) substrate has recently increasingly been adopted as a semiconductor substrate used for manufacturing a semiconductor device. SiC has a band gap wider than Si (silicon) that has been used more commonly. Therefore, a semiconductor device including an SiC substrate is advantageous in a high breakdown voltage, a low ON resistance and less lowering in characteristics in an environment at a high temperature.

In order to efficiently manufacture a semiconductor device, a substrate is required to have a size not smaller than a certain size. According to U.S. Pat. No. 7,314,520 (Patent Document 1), an SiC substrate not smaller than 76 mm (3 inches) can be manufactured.

PRIOR ART DOCUMENT

Patent Document

Patent Document 1: U.S. Pat. No. 7,314,520

SUMMARY OF THE INVENTION

Problems to be Solved by the Invention

Industrially, the size of an SiC single crystal substrate is still limited to approximately 100 mm (4 inches). Accordingly, semiconductor devices cannot be efficiently manufactured using large single crystal substrates, disadvantageously. This disadvantage becomes particularly serious in the case of using the property of a plane other than the (0001) plane in SiC of hexagonal system. Hereinafter, this will be described.

An SiC single crystal substrate small in defect is usually manufactured by slicing an SiC ingot obtained by growth in the (0001) plane, which is less likely to cause stacking fault. Hence, a single crystal substrate having a plane orientation other than the (0001) plane is obtained by slicing the ingot not in parallel with its grown surface. This makes it difficult to sufficiently ensure the size of the single crystal substrate, or many portions in the ingot cannot be used effectively. For this reason, it is particularly difficult to effectively manufacture a semiconductor device that employs a plane other than the (0001) plane of SiC.

Instead of increasing the size of such an SiC single crystal substrate with difficulty, it is considered to use a silicon carbide substrate having a supporting portion and a plurality of small single crystal substrates connected thereon. The size of the silicon carbide substrate can be made larger by increasing the number of single crystal substrates as required. However, in the case where such a supporting portion and single crystal substrate are connected, the strength of the connection may be insufficient.

The present invention was made in view of the above-described problem, and an object of the present invention is to provide a method for manufacturing a silicon carbide substrate that can have the connecting strength between a single crystal substrate and a supporting portion increased.

Means for Solving the Problems

A method according to the present invention for manufacturing a silicon carbide substrate includes the following steps.

At least one single crystal substrate, each having a backside surface and made of silicon carbide, and a supporting portion having a main surface and made of silicon carbide, are prepared. In the preparing step, at least one of the backside surface and main surface is formed by machining. By this forming step, a surface layer having distortion in the crystal structure is formed on at least one of the backside surface and main surface. The surface layer is removed at least partially. Following this removal, the backside surface and main surface are connected to each other.

According to the present invention, the connecting strength between the backside surface and main surface can be increased by removing the surface layer having distortion.

Preferably, the step of removing the surface layer at least partially is carried out by sublimation of the surface layer. Accordingly, the surface layer can be readily removed at least partially while avoiding additional occurrence of distortion in the crystal structure. More preferably, in the step of preparing at least one single crystal substrate and a supporting portion, a surface layer is formed at the backside surface, and in the step of removing the surface layer at least partially, the surface layer formed at the backside surface is removed at least partially. Accordingly, the surface layer formed at the backside surface of at least one single crystal substrate can be removed partially. Further preferably, in the step of removing the surface layer at least partially, the backside surface and main surface are arranged to face each other prior to sublimation of the surface layer. Accordingly, since the backside surface and main surface are already facing each other at the point of time when the surface layer is removed, subsequent connection therebetween is facilitated.

The step of removing the surface layer at least partially may be carried out by sacrificial oxidation. The step of removing the surface layer at least partially may be carried out chemically.

Preferably, the step of removing the surface layer at least partially is carried out such that the surface layer is removed entirely. Accordingly, the connecting strength between the backside surface and main surface can be further improved.

Preferably, the step of connecting the backside surface and the main surface to each other is carried out by causing sublimation of silicon carbide from the main surface and recrystallization of silicon carbide on the backside surface, between the backside surface and main surface. In the case where the step of removing the surface layer at least partially is carried out by sublimation of the surface layer, both the removing step and connecting step can be carried out by means of sublimation. Further, in the case where the backside surface and main surface are arranged to face each other prior to sublimation of the surface layer in the step of removing the surface layer at least partially, the backside surface and main surface can be connected to each other by just changing the direction of mass transfer through sublimation, after the surface layer is sublimed. Moreover, in the case where the surface layer is present, not only on the backside surface, but also on the main surface, the surface layer on the main surface can be eliminated by the sublimation in the step of connecting the backside surface and main surface to each other.

Preferably, at least one single crystal substrate includes a plurality of single crystal substrates. Accordingly, a silicon carbide substrate having a large area can be obtained.

The step of removing the surface layer at least partially set forth above may be carried out by etching the surface layer. This etching includes, for example, wet etching or gas etching.

In the step of preparing at least one single crystal substrate, the backside surface may be polished mechanically. Accordingly, the backside surface can be rendered flat. Further, the thickness of the surface layer formed on the backside surface can be reduced.

In the step of preparing at least one single crystal substrate, the backside surface may be formed by slicing. In other words, the backside surface is a surface formed by slicing, and not polished thereafter. Accordingly, there are irregularities on the backside surface. In the case where the supporting portion is provided by sublimation on the backside surface, the space in the depression of the irregularities can be used as a cavity where sublimation gas spreads.

Preferably, at least one single crystal substrate includes a first single substrate having a first surface opposite to the backside surface. The first surface has an off angle greater than or equal to 50° and less than or equal to 65° relative to the {0001} plane. Accordingly, the channel mobility at the first surface can be increased as compared to the case where the first plane is the {0001} plane.

More preferably, the angle between the off orientation of the first surface and the <1-100> direction of the first single crystal substrate is less than or equal to 5°. Further preferably, the off angle of the first surface relative to the {03-38} plane in the <1-100> direction of the first single crystal substrate is greater than or equal to −3° and less than or equal to 5°.

Effect of the Invention

As apparent from the description set forth above, the connecting intensity between a single crystal substrate and a supporting portion can be increased according to a method for manufacturing a silicon carbide substrate of the present invention.

MODES FOR CARRYING OUT THE INVENTION

Embodiments of the present invention will be described hereinafter based on the drawings.

First Embodiment

Figure 1:
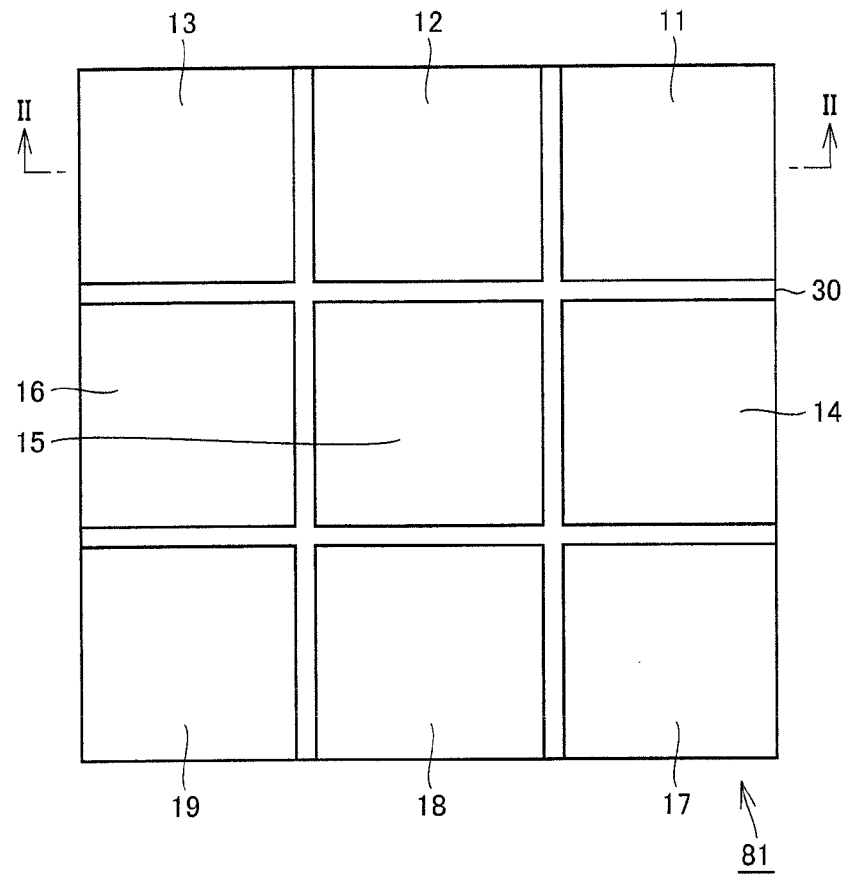
FIG. 1 is a plan view schematically showing a configuration of a silicon carbide substrate in a first embodiment of the present invention.
Figure 2:
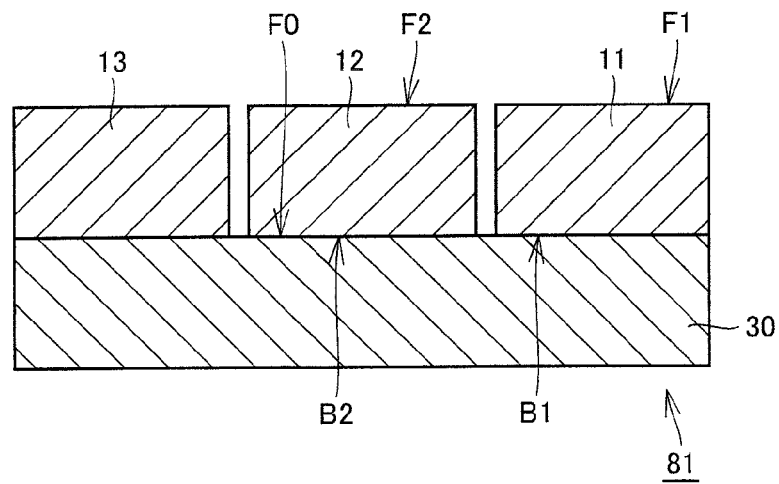
FIG. 2 is a schematic sectional view taken along line II-II in FIG. 1.

Referring to FIGS. 1 and 2, a silicon carbide substrate 81 of the present embodiment includes a supporting portion 30, and single crystal substrates 11-13. Supporting portion 30 is a layer made of silicon carbide, and the layer has a main surface FO. Single crystal substrates 11-19 are made of silicon carbide, arranged in a matrix, as shown in FIG. 1. The backside surface of each of single crystal substrates 11-19 and main surface FO of supporting portion 30 are connected to each other. For example, single crystal substrate 11 (first single crystal substrate) includes a surface F1 (first surface) and a backside surface B1 (first backside surface) opposite to each other. Single crystal substrate 12 has a surface F2 (second surface) and a backside surface B2 (second backside surface) opposite to each other. Each of backside surfaces B1 and B2 is connected to main surface FO.

The surface of each of single crystal substrates 11-19 preferably has a plane orientation {03-38}. As the plane orientation, {0001}, {11-20} or {1-100} can be employed. Further, a plane offset by several degrees from each of the aforementioned plane orientation can also be used.

A method for manufacturing silicon carbide substrate 81 will be described hereinafter. Although only single crystal substrates 11 and 12 among single crystal substrates 11-19 are mentioned for the sake of simplification in the following description, single crystal substrates 13-19 follow the description of single crystal substrates 11 and 12. The same applies to the description in other embodiments.

Figure 3:
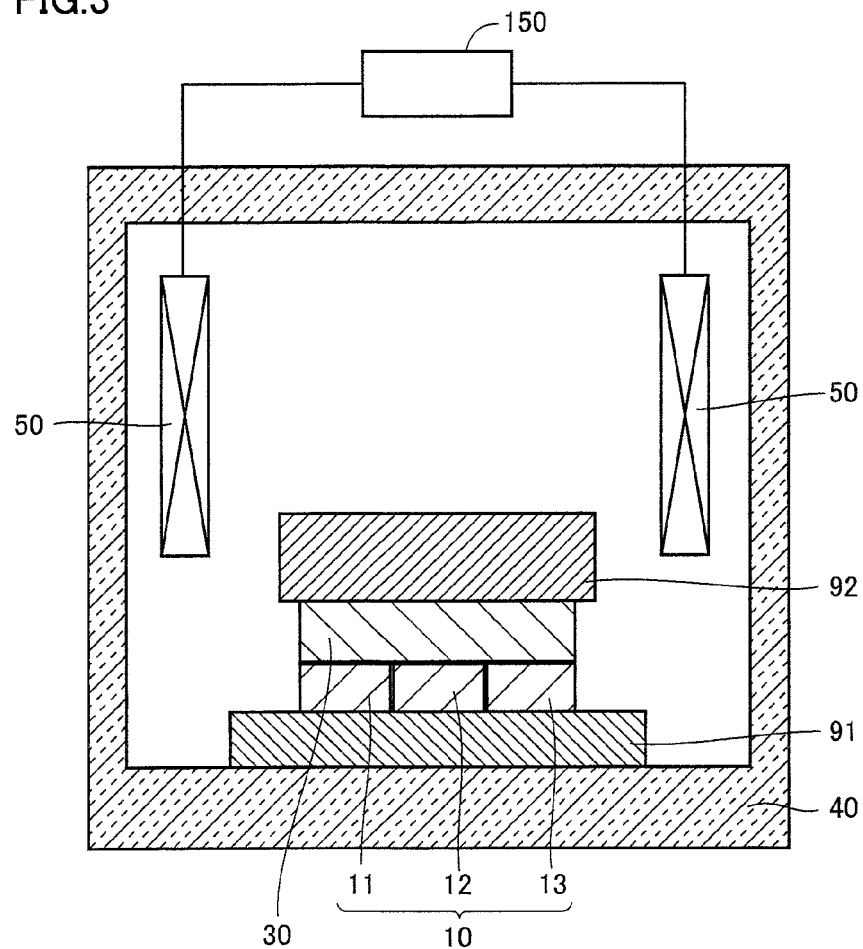
FIG. 3 is a sectional view schematically showing a first step in a method for manufacturing a silicon carbide substrate in the first embodiment of the present invention.
Figure 4:
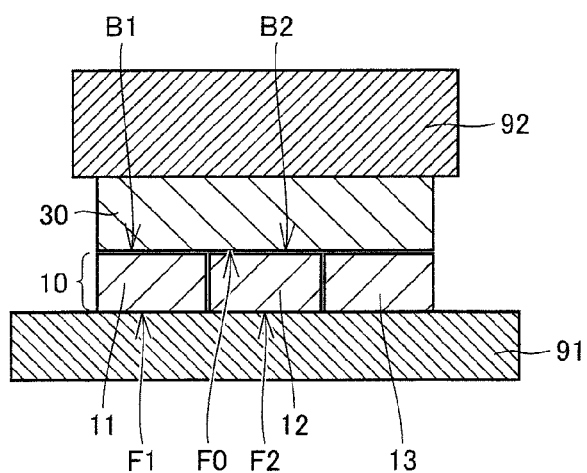
FIG. 4 is a partial enlarged view of FIG. 3.

Referring to FIGS. 3 and 4, there are provided a supporting portion 30, single crystal substrates 11-19 (generically refer to as "single crystal substrate group 10"), and a heating device. At this stage, supporting portion 30 is not necessarily in the form of single crystal, and may take the form of polycrystal or sintered compact.

The heating device includes first and second heat bodies 91 and 92, a heat-insulating container 40, a heater 50, and a heater power source 150. Heat-insulating container 40 is made of a material of high heat resistance. Heater 50 is, for example, an electrical resistance heater. First and second heat bodies 91 and 92 are capable of heating supporting portion 30 and single crystal substrate group 10 by reradiation of the heat obtained by absorbing the emitted heat from heater 50. First and second heat bodies 91 and 92 are made of graphite, for example, having low porosity.

First heat body 91, single crystal substrate group 10, supporting portion 30, and second heat body 92 are arranged so as to be stacked in the cited order. Specifically, single crystal substrates 11-19 are arranged in a matrix on first heat body 91. Supporting portion 30 is placed on the surface of single crystal substrate group 10. Then, second heat body 92 is placed on supporting portion 30. The stacked first heat body 91, single crystal substrate group 10, supporting portion 30 and second heat body 92 are accommodated in heat-insulating container 40 in which heater 50 is provided.

The atmosphere in heat-insulating container 40 is obtained by reducing the atmospheric pressure. The pressure of the atmosphere is preferably set higher than $10^{-1}$ Pa and lower than $10^4$ Pa.

The aforementioned atmosphere may be inert gas atmosphere. For inert gas, noble gas such as He or Ar, nitrogen gas, or mixed gas of the noble gas and nitrogen gas can be used, for example. In the case where mixed gas is employed, the ratio of the nitrogen gas is 60%, for example. The pressure in the processing chamber is preferably less than or equal to 50 kPa, more preferably less than or equal to 10 kPa.

Figure 5:
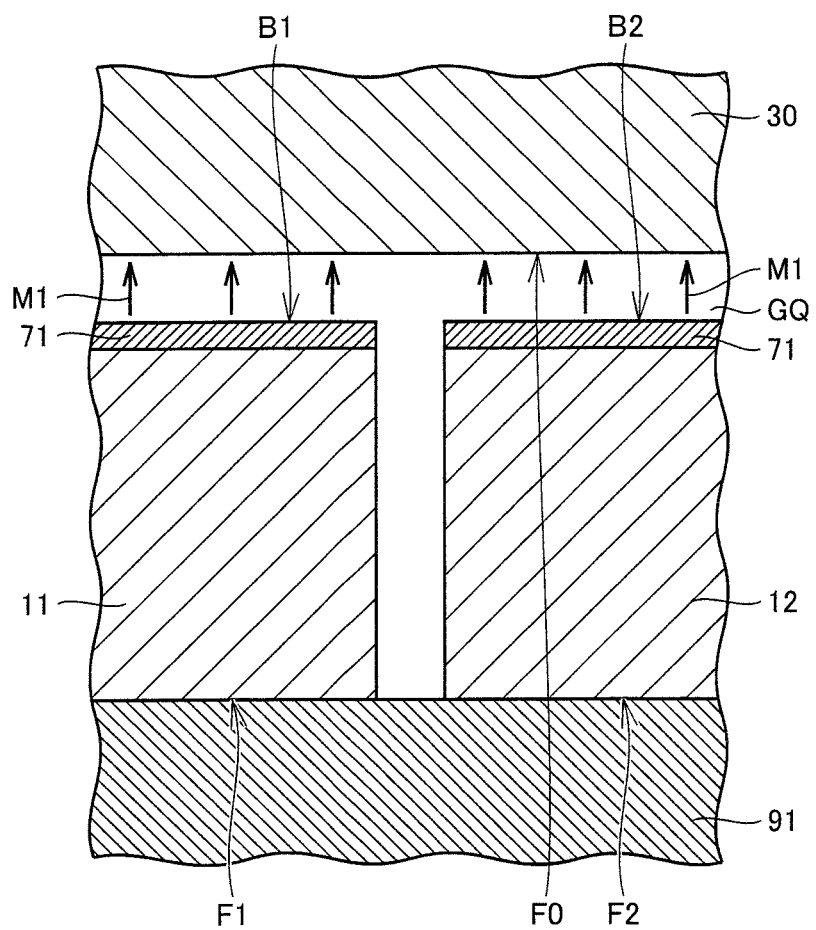
FIG. 5 is a partial sectional view schematically showing a mass transfer direction through sublimation in a second step of the method for manufacturing a silicon carbide substrate in the first embodiment of the present invention.

Referring to FIG. 5, a surface layer 71 (FIG. 5) is formed on the backside surface of single crystal substrate group 10 (FIG. 3) prepared as set forth above. For example, surface layer 71 is formed on each of backside surfaces B1 and B2. In the preparing step of single crystal substrates 11 and 12, surface layer 71 is a layer having distortion in the crystal structure, formed at backside surfaces B1 and B2 by machining thereof For example, in the case where single crystal substrates 11-19 are produced by being sliced from a bulk of silicon carbide single crystal, the surface layer is produced by this slicing. The surface layer produced by slicing has a thickness of approximately 20 for example. In the case where mechanical polishing is applied to backside surfaces B1 and B subsequent to slicing, the relatively thick surface layer caused by slicing can be removed. However, a relatively thin surface layer will be produced by this mechanical polishing.

It is to be noted that supporting portion 30 is just situated on each of single crystal substrates 11 and 12, and not connected. Therefore, a minute cavity GQ is present between each of back surfaces B1 and B2 and supporting portion 30. Therefore, surface layer 71 is facing cavity GQ.

By heater 50, single crystal substrate group 10 including single crystal substrates 11 and 12, and supporting portion 30 are heated by first and second heat bodies 91 and 92, respectively, up to a temperature corresponding to a level at which sublimation recrystallization reaction occurs. This heating is first carried out to cause a temperature difference such that the temperature of single crystal substrate group 10 is higher than the temperature of supporting portion 30. Namely, a temperature gradient is produced such that the temperature becomes lower in the upward direction in the drawing. This temperature gradient is preferably greater than or equal to 1° C./cm and less than or equal to 100° C./cm, more preferably greater than or equal to 10° C./cm and less than or equal 50° C./cm, between single crystal substrate group 10 and supporting portion 30.

As described above, when the temperature of each of single crystal substrates 11 and 12 is set higher than the temperature of supporting portion 30, mass transfer occurs by sublimation in cavity GQ, as indicated by arrow M1 in the drawing. As a result, surface layer 71 is removed at least partially, preferably entirely. The sublimated silicon carbide is recrystallized on main surface FO of supporting portion 30 to be absorbed thereby.

Figure 6:
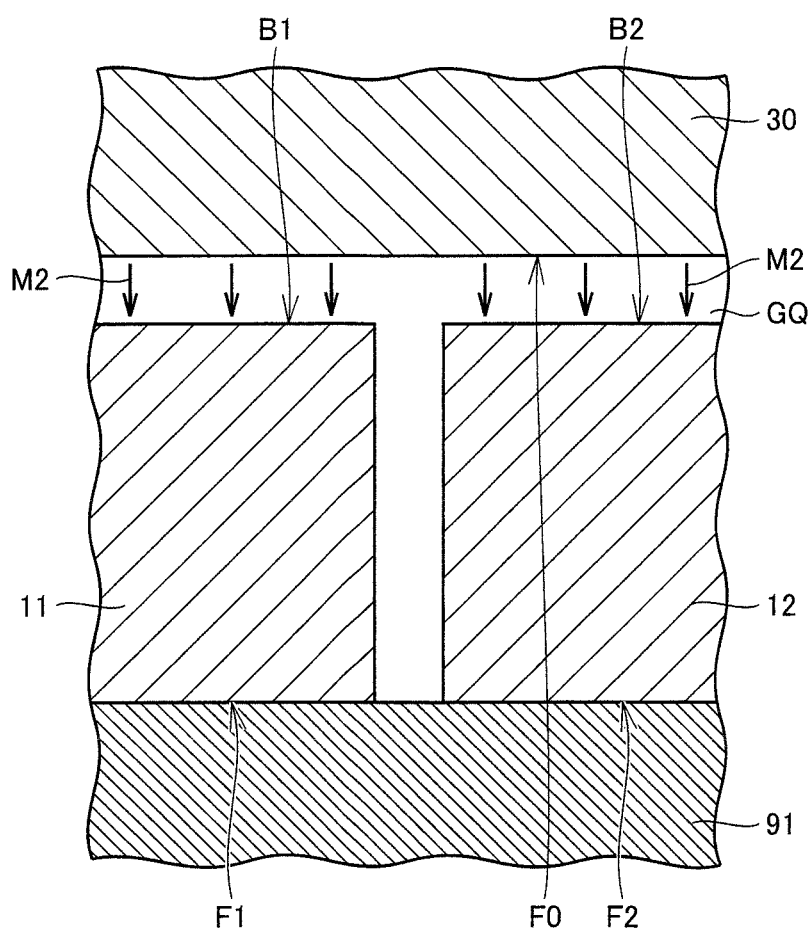
FIG. 6 is a partial sectional view schematically showing a mass transfer direction through sublimation in a third step of the method for manufacturing a silicon carbide substrate in the first embodiment of the present invention.

Referring to FIG. 6, the temperature of supporting portion 30 is set higher than the temperature of each of single crystal substrates 11 and 12. Specifically, a temperature gradient is produced such that the temperature becomes lower in the downward direction in the drawing. In other words, the direction of the temperature gradient is inverted. This temperature gradient is preferably greater than or equal to 1° C./cm and less than or equal to 200° C./cm, more preferably greater than or equal to 10° C./cm and less than or equal to 50° C./cm, between single crystal substrate group 10 and supporting portion 30. By such a temperature gradient, mass transfer by sublimation occurs in cavity GQ, as indicated by arrow M2 in the drawing.

Figure 7:
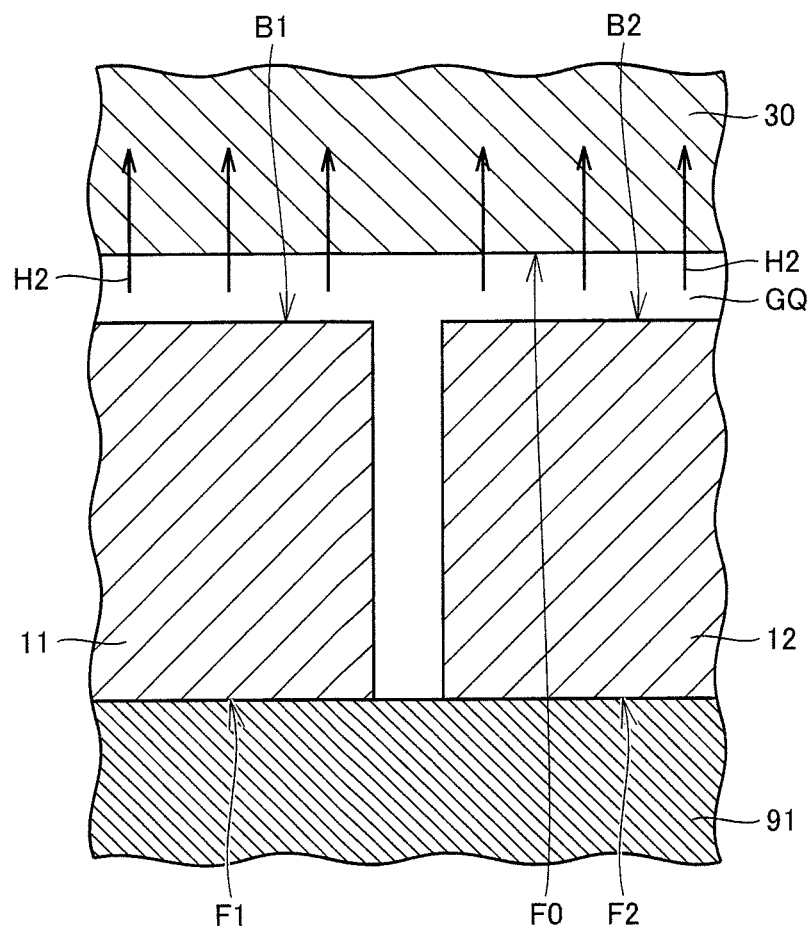
FIG. 7 is a partial sectional view schematically showing a cavity transfer direction through sublimation in the third step of the method for manufacturing a silicon carbide substrate in the first embodiment of the present invention.

Referring to FIG. 7, the mass transfer indicated by arrow M2 in FIG. 6 corresponds, conversely, to the hollow shift indicated by arrow H2 in FIG. 7, in association with the hollow present in cavity GQ. There is a great in-plane variation in the height of cavity GQ (the dimension in the vertical direction in the drawing). This variation causes a great in-plane variation in the rate of the hollow shift corresponding to cavity GQ (arrow H2 in the drawing).

Figure 8:
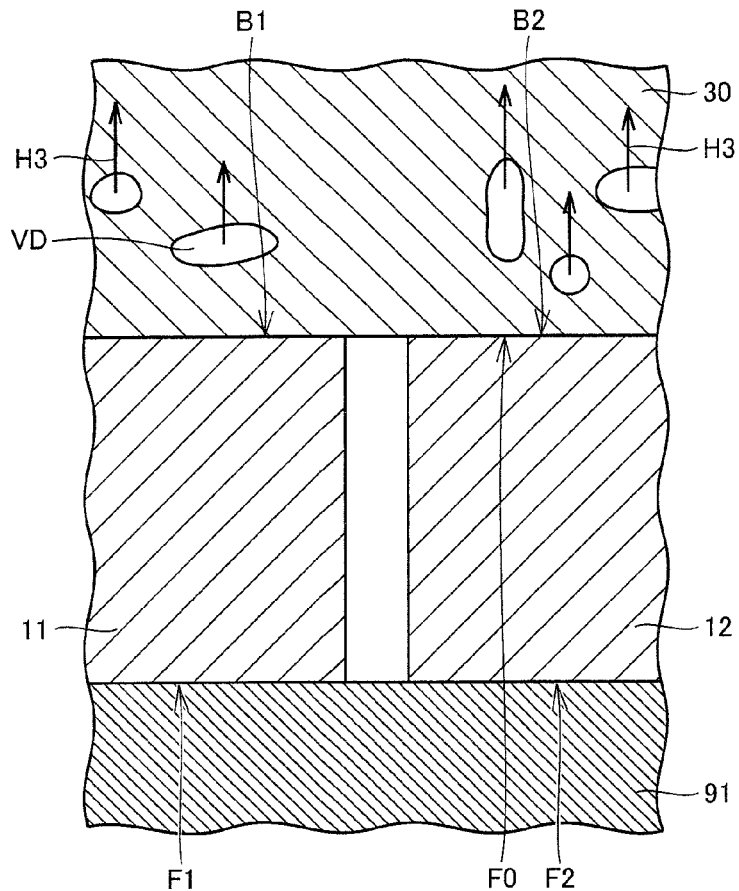
FIG. 8 is a partial sectional view schematically showing a void transfer direction through sublimation in the second step of the method for manufacturing a silicon carbide substrate in the first embodiment of the present invention.

Referring to FIG. 8, the hollow corresponding to cavity GQ (FIG. 7) cannot be shifted while maintaining its shape due to the aforementioned variation, and is instead decomposed into a plurality of voids VD (FIG. 7). As a result, each of single crystal substrates 11 and 12 is connected to supporting portion 30.

As the heating progresses, void VD moves away from main surface FO, as indicated by arrow H3. Accordingly, the connecting strength is further increased. Moreover, the crystal structure of supporting portion 30 gradually changes to that corresponding to the crystal structure of single crystal substrate group 10 from the region closer to single crystal substrate group 10. Thus, a silicon carbide substrate 81 is obtained.

According to the present embodiment, surface layer 71 (FIG. 5) is removed, not mechanically, but by sublimation. By this removal, surface layer 71 having distortion can be removed while avoiding additional occurrence of distortion in the crystal structure at backside surfaces B1 and B2. Thus, the connecting strength can be increased between each of backside surfaces B1 and B2 and main surface FO. Furthermore, surface layer 71 can be removed by a simple step of heat processing. Moreover, increase in the electrical resistance in the thickness direction (vertical direction in FIG. 2) caused by the crystal defect at surface layer 71 can be suppressed.

Prior to sublimation of surface layer 71, backside surfaces B1 and B2 are arranged to face main surface FO, as shown in FIG. 5. Accordingly, the subsequent step of connecting each of backside surfaces B1 and B2 to main surface FO (FIGS.

6-8) can be facilitated since the surfaces are already facing each other at the point of time surface layer 71 is removed.

Moreover, the step of removing surface layer 71 and the step of connecting each of backside surfaces B1 and B2 to main surface FO are both carried out by sublimation. Specifically, the two steps can be carried out by just inverting the temperature gradient for the sublimation and recrystallization. Accordingly, the manufacturing step of silicon carbide substrate 81 can be simplified.

Since sublimation from main surface FO occurs, as shown in FIG. 6, in the connection of each of backside surfaces B1 and B2 to main surface FO, the surface layer, if present on main surface FO, will be removed. Accordingly, adverse influence of the surface layer on the connecting strength can be avoided.

Since surfaces F1 and F2 (FIG. 2) are provided, the surface area of silicon carbide substrate 81 can be increased as compared to the case where only surface F1 is provided.

Preferably, each of single crystal substrates 11-19 has a crystal structure of the 4H polytype. Thus, a silicon carbide substrate 81 suitable for manufacturing a semiconductor directed to electric power use can be obtained.

Preferably, in order to prevent silicon carbide substrate 81 from cracking, the difference between the thermal expansion coefficient of supporting portion 30 and the thermal expansion coefficient of single crystal substrates 11-19 in silicon carbide substrate 81 is made as small as possible. Accordingly, occurrence of a warpage at silicon carbide substrate 81 can be suppressed. To this end, the crystal structure of supporting portion 30 is to be identical to that of single crystal substrates 11-19. Specifically, the crystal structure of supporting portion 30 is made to match that of single crystal substrates 11-19 by sufficient mass transfer (FIG. 8: arrow H3) through sublimation and recrystallization.

Preferably, the in-plane variation in the thickness of each of supporting portion 30 and single crystal substrate group 10 (FIG. 4) prepared prior to the heat treatment is set as small as possible. For example, this variation is set less than or equal to 10 μm. For the purpose of suppressing in-plane variation, a flattening process, for example, is to be carried out.

Preferably, the electrical resistivity of supporting portion 30 prepared prior to the heat treatment is set less than 50 mΩ·cm, more preferably, less than 10 mΩ·cm.

Preferably, the impurity concentration in supporting portion 30 of silicon carbide substrate 81 is set greater than or equal to $5 \times 10^{18}$ cm$^{-3}$, more preferably greater than or equal to $1 \times 10^{20}$ cm$^{-3}$. By manufacturing a vertical type semiconductor device conducting a current flow vertically such as a vertical type MOSFET (Metal Oxide Semiconductor Field Effect Transistor) using such silicon carbide substrate 81, the ON resistance of the vertical semiconductor device can be reduced.

Preferably, the average value of the electrical resistivity of silicon carbide substrate 81 is set less than or equal to 5 mΩ·cm, more preferably less than or equal to 1 mΩ·cm.

Preferably, the thickness of silicon carbide substrate 81 (dimension in the vertical direction in FIG. 2) is greater than or equal to 300 μm.

Preferably, surface F1 has an off angle greater than or equal to 50° and less than or equal to 65° relative to the {0001} plane. Accordingly, the channel mobility at surface F1 can be increased as compared to the case where surface F1 is the {0001} plane. More preferably, the first or second condition set forth below is satisfied.

Under the first condition, the angle between the off orientation of surface F1 and the <1-100> direction of single crystal substrate 11 is less than or equal to 5°. Further preferably, the off angle of surface F1 relative to the {03-38} plane in the <1-100> direction of single crystal substrate 11 is greater than or equal to −3° and less than or equal to 5°.

Under the second condition, the angle between the off orientation of surface F1 and the <11-20> direction of single crystal substrate 11 is less than or equal to 5°.

As used herein, "the off angle of surface F1 relative to the {03-38} plane in the <1-100> direction" refers to the angle between the orthogonal projection of the normal line of surface F1 on the projecting plane defined by the <1-100> direction and <0001> direction and the normal line of the {03-38} plane. The sign is positive when the aforementioned orthogonal projection approaches the <1-100> direction in parallel, and negative when the aforementioned orthogonal projection approaches the <0001> direction in parallel.

Although the above description is based on the preferable orientation for surface F1 of single crystal substrate 11, preferably the same applies to the orientation for each surface of other single crystal substrates 12-19.

Prior to the arrangement of single crystal substrates 11-19 for connecting to supporting portion 30, the backside surface of single crystal substrates 11-19 may be mechanically polished beforehand. Since the thickness of surface layer 71 is reduced by this polishing, the subsequent removal of surface layer 71 by sublimation (FIG. 5) can be further facilitated.

An electrical resistance heater was taken as an example of heater 50, namely resistance heating. However, other heating methods can be used. For example, the high-frequency induction heating or lamp annealing method may be employed.

Second Embodiment

A silicon carbide substrate in the present embodiment has a structure substantially similar to that of silicon carbide substrate 81 (FIGS. 1 and 2). The manufacturing method thereof will be described hereinafter.

Figure 9:
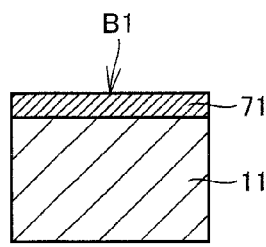
FIG. 9 is a sectional view schematically showing a configuration of a single crystal substrate in a first step of a method for manufacturing a silicon carbide substrate in a second embodiment of the present invention.
Figure 10:
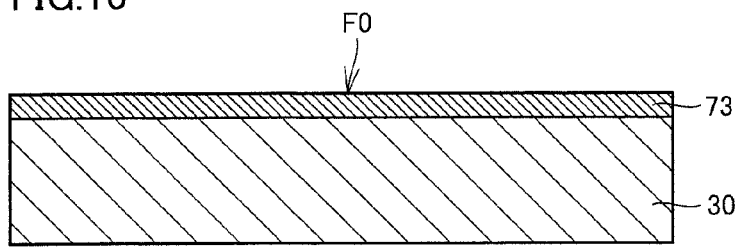
FIG. 10 is a sectional view schematically showing a configuration of a supporting portion in the first step of a method for manufacturing a silicon carbide substrate in a second embodiment of the present invention.

Referring to FIGS. 9 and 10, a single crystal substrate 11 having a surface layer 71 formed at backside surface B1 is prepared. Further, similar single crystal substrates 12-19 (FIG. 1) are prepared. In addition, a supporting portion 30 having a surface layer 73 formed at main surface FO is prepared. Supporting portion 30 does not necessarily have to take the form of single crystal, and may be polycrystal or sintered compact.

Then, at least one of surface layer 71 and 73 is chemically removed partially. Specifically, surface layers 71 and 73 are etched. The etching method includes, for example, wet etching, gas etching, RIE (Reactive Ion Etching), or etching by sacrificial oxidation.

Figure 11:
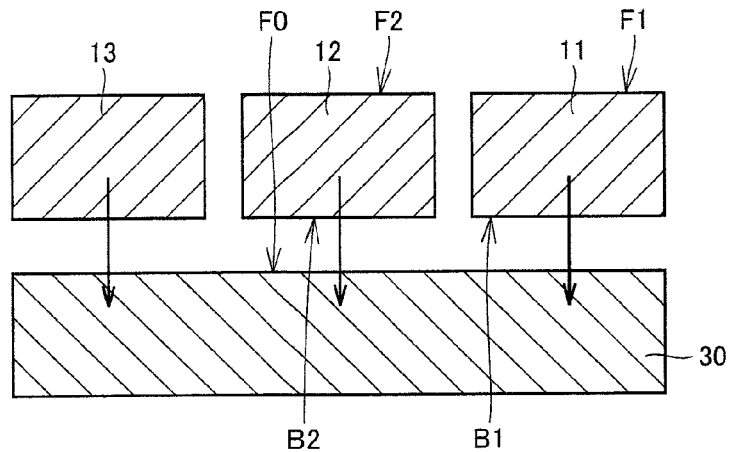
FIG. 11 is a sectional view schematically showing one step in the method for manufacturing a silicon carbide substrate in a second embodiment of the present invention.

Referring to FIG. 11, single crystal substrates 11 and 12 are mounted on supporting portion 30 such that backside surfaces B1 and B2 face main surface FO. Then, supporting portion 30, and single crystal substrates 11 and 12 are heated, whereby each of backside surfaces B1 and B2 is connected to main surface FO. Thus, a silicon carbide substrate 81 (FIG. 2) is obtained.

The configuration other than that described above is substantially similar to the configuration of the first embodiment set forth above. The same or corresponding elements have the same reference characters allotted, and description thereof will not be repeated.

Although a supporting portion 30 having a surface layer 73 is prepared in the present embodiment, a supporting portion 30 without a surface layer 73 may be prepared instead. Furthermore, although a single crystal substrate 11 having surface layer 71 is prepared, a single crystal substrate 11 without a surface layer 71 may be prepared instead.

Third Embodiment

Figure 12:
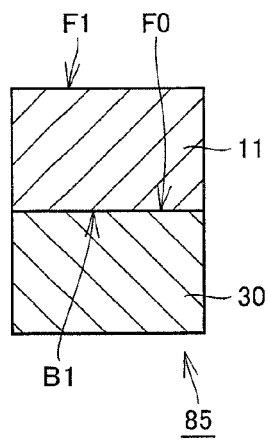
FIG. 12 is a sectional view schematically showing a configuration of a silicon carbide substrate in a third embodiment of the present invention.

Referring mainly to FIG. 12, a silicon carbide substrate 85 in the present embodiment includes only single crystal substrate 11, instead of single crystal substrates 11-19 (FIG. 1). The configuration other than that described above is substantially similar to the configuration of the first embodiment set forth above. The same or corresponding elements have the same reference characters allotted, and description thereof will not be repeated.

Fourth Embodiment

Figure 13:
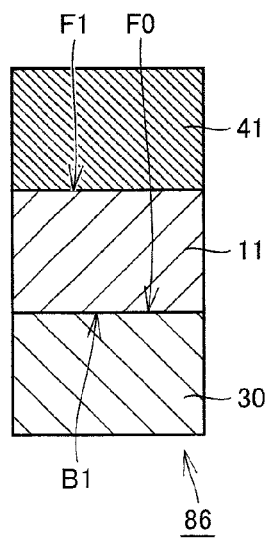
FIG. 13 is a sectional view schematically showing a configuration of a silicon carbide substrate in a fourth embodiment of the present invention.

Referring mainly to FIG. 13, a silicon carbide substrate 86 in the present embodiment includes a single crystal substrate 41, in addition to single crystal substrate 11. Single crystal substrate 41 is connected to surface F1 of single crystal substrate 11.

Fifth Embodiment

Figure 14:
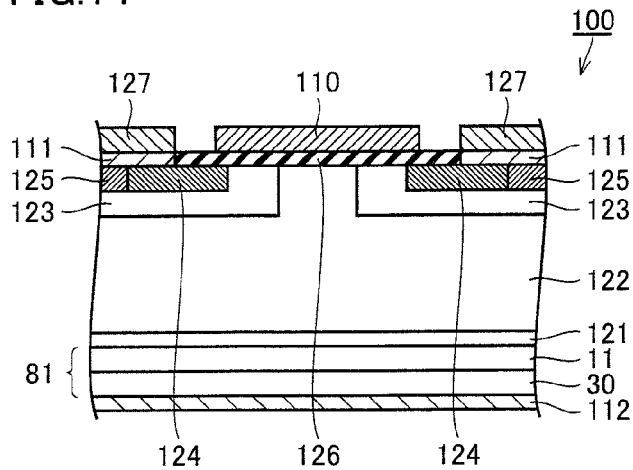
FIG. 14 is a partial sectional view schematically showing a configuration of a semiconductor device in a fifth embodiment of the present invention.

Referring to FIG. 14, a semiconductor device 100 in the present embodiment is a vertical type DiMOSFET (Double Implanted Metal Oxide Semiconductor Field Effect Transistor), including a silicon carbide substrate 81, a buffer layer 121, a breakdown voltage holding layer 122, a p region 123, an n⁺ region 124, a p⁺ region 125, an oxide film 126, a source electrode 111, an upper source electrode 127, a gate electrode 110, and a drain electrode 112.

Silicon carbide substrate 81 has an n type conductivity in the present embodiment, and includes supporting portion 30 and single crystal substrate 11, as described in the first embodiment. Drain electrode 112 is provided on supporting portion 30 such that supporting portion 30 is located between single crystal substrate 11 and drain electrode 112. Buffer layer 121 is provided on single crystal substrate 11 such that single crystal substrate 11 is located between supporting portion 30 and buffer layer 121.

Buffer layer 121 has an n type conductivity, and a thickness of 0.5 μm, for example. The concentration of the n type conductivity impurities in buffer layer 121 is $5 \times 10^{17}$ cm$^{-3}$, for example.

Breakdown voltage holding layer 122 is formed on buffer layer 121, and made of silicon carbide of n type conductivity. For example, breakdown voltage holding layer 122 has a thickness of 10 μm and an n type conductivity impurity concentration of $5 \times 10^{15}$ cm$^{-3}$.

At the surface of this breakdown voltage holding layer 122, a plurality of p regions 123 of p type conductivity are formed spaced apart from each other. In p type region 123, n⁺ region 124 is formed at the surface layer of p region 123. At a region adjacent to this n⁺ region 124, p⁺ region 125 is formed. There is also an oxide film 126 formed extending from above n⁺ region 124 at one of p regions 123, over p region 123, a region of breakdown voltage holding layer 122 exposed between the two p regions 123, and the other p region 123, as far as above n⁺ region 124 at the relevant other p region 123. Gate electrode 110 is formed on oxide film 126. Source electrode 111 is formed on n⁺ region 124 and p⁺ region 125. Upper source electrode 127 is formed on source electrode 111.

The maximum value of the nitrogen atom concentration at the region within 10 nm from the boundary between oxide film 126 and the semiconductor layer, i.e. n⁺ region 124, p⁺ region 125, p region 123 and breakdown voltage holding layer 122, is greater than or equal to $1 \times 10^{21}$ cm$^{-3}$. Accordingly, the mobility at particularly the channel region under oxide film 126 (the portion of p region 123 in contact with oxide film 126, and located between n⁺ region 124 and breakdown voltage holding layer 122) can be improved.

A method for manufacturing semiconductor device 100 will be described hereinafter. Although the steps in the proximity of single crystal substrate 11 among single crystal substrates 11-19 (FIG. 1) will be shown in FIGS. 16-19, similar steps are carried out in the proximity of each of single crystal substrate 12-single crystal substrate 19.

Figure 15:
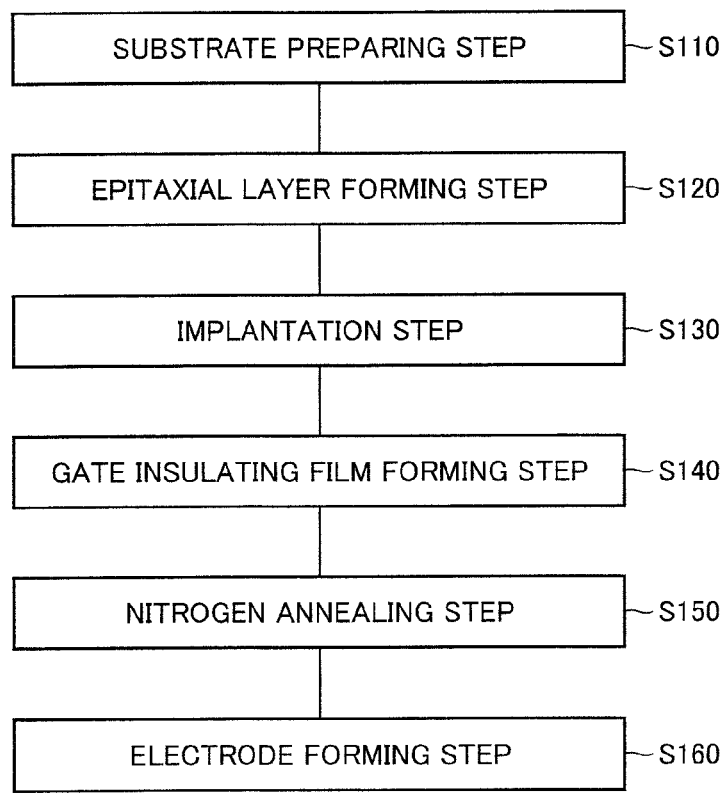
FIG. 15 is a schematic flowchart of a method for manufacturing a semiconductor device in the fifth embodiment of the present invention.

At a substrate preparing step (step S110: FIG. 15), silicon carbide substrate 81 (FIGS. 1 and 2) is prepared. The conductivity type of silicon carbide substrate 81 is the n type.

Figure 16:
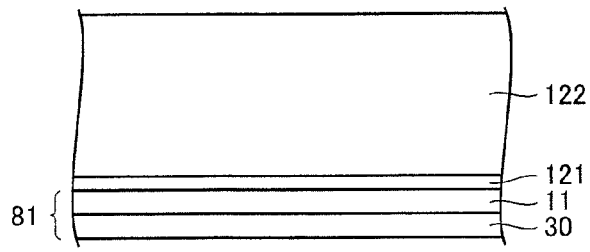
FIG. 16 is a partial sectional view schematically showing a first step in the method for manufacturing a semiconductor device in the fifth embodiment of the present invention.

Referring to FIG. 16, by the epitaxial layer forming step (step S120: FIG. 15), buffer layer 121 and breakdown voltage holding layer 122 are formed as set forth below.

First, buffer layer 121 is formed on single crystal substrate 11 of silicon carbide substrate 81. Buffer layer 121 is made of silicon carbide of n type conductivity, and is an epitaxial layer having a thickness of 0.5 μm, for example. Further, the concentration of the conductivity type impurities in buffer layer 121 is $5 \times 10^{17}$ cm$^{-3}$, for example.

Then, breakdown voltage holding layer 122 is formed on buffer layer 121. Specifically, a layer of silicon carbide of n type conductivity is produced by epitaxial growth. Breakdown voltage holding layer 122 is set to have a thickness of 10 μm, for example. Further, the concentration of the n type conductivity impurities in breakdown voltage holding layer 122 is $5 \times 10^{15}$ cm$^{-3}$, for example.

Figure 17:
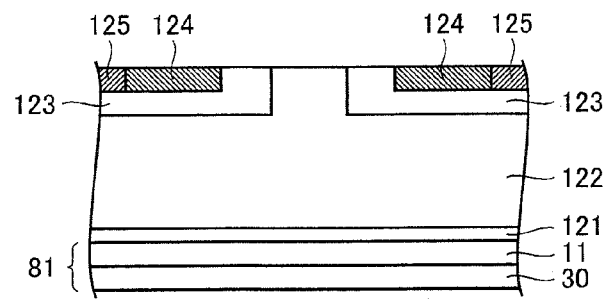
FIG. 17 is a partial sectional view schematically showing a second step in the method for manufacturing a semiconductor device in the fifth embodiment of the present invention.

Referring to FIG. 17, by an implantation step (step S130: FIG. 15), p type region 123, n⁺ region 124, and p⁺ region 125 are formed as set forth below.

First, p type conductivity impurities are selectively implanted to a portion of breakdown voltage holding layer 122 to form p region 123. Then, n type conductivity impurities are selectively implanted into a predetermined region to form n⁺ region 124. By selectively implanting p type conductivity impurities into a predetermined region, p⁺ region 125 is formed. Selective implantation of impurities is conducted using a mask composed of an oxide film, for example.

Following the implantation step, an activation annealing process is carried out. For example, annealing is carried out for 30 minutes at the heating temperature of 1700° C. in an argon atmosphere.

Figure 18:
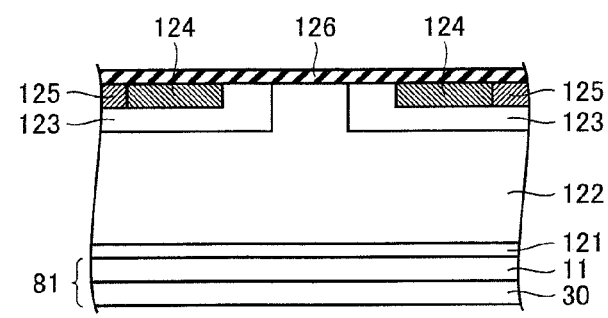
FIG. 18 is a partial sectional view schematically showing a third step in the method for manufacturing a semiconductor device in the fifth embodiment of the present invention.

Referring to FIG. 18, a gate insulating film forming step (step S140: FIG. 15) is carried out. Specifically, oxide film 126 is formed so as to cover breakdown voltage holding layer 122, p region 123, n⁺ region 124, and p⁺ region 125. This forming step may be carried out by dry oxidation (thermal oxidation). The conditions of dry oxidation include, for example, a heating temperature of 1200° C., and a heating duration of 30 minutes.

Then, a nitrogen annealing step (step S150) is carried out. Specifically, annealing is carried out in a nitric oxide (NO) atmosphere. The conditions of this process include, for example, a heating temperature of 1100° C., and a heating duration of 120 minutes. As a result, nitrogen atoms are introduced in the vicinity of the boundary between oxide film 126 and each of breakdown voltage holding layer 122, p region 123, n⁺ region 124 and p⁺ region 125.

Subsequent to this annealing step employing nitric oxide, an annealing process employing argon (Ar) gas identified as inert gas may be further carried out. The conditions of this process include, for example, a heating temperature of 1100° C. and a heating duration of 60 minutes.

Figure 19:
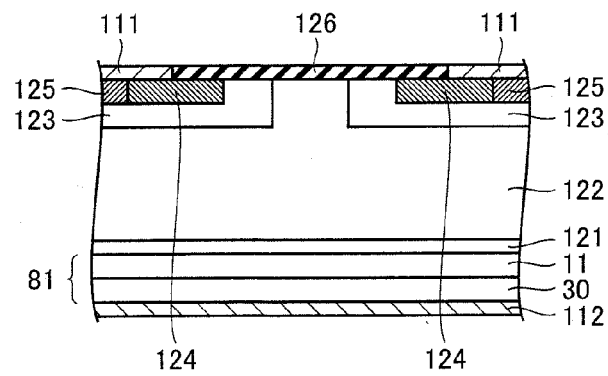
FIG. 19 is a partial sectional view schematically showing a fourth step in the method for manufacturing a semiconductor device in the fifth embodiment of the present invention.

Referring to FIG. 19, by an electrode forming step (step S160: FIG. 15), source electrode 111 and drain electrode 112 are formed as set forth below.

First, a resist film having a pattern is formed on oxide film 126 by photolithography. Using this resist film as a mask, the portion of oxide film 126 located above $n^+$ region 124 and $p^+$ region 125 is removed by etching. Accordingly, an opening is formed in oxide film 126. Then, a conductor film is formed to be brought into contact with each of $n^+$ region 124 and $p^+$ region 125 at this opening. By removing the resist film, the portion of the aforementioned conductor film located on the resist film is removed (lift off). This conductive film may be a metal film, made of nickel (Ni), for example. As a result of this lift off, source electrode 111 is formed.

At this stage, a heat treatment is preferably carried out for alloying. For example, a heat treatment is carried out for 2 minutes at the heating temperature of 950° C. in the atmosphere of argon (Ar) gas identified as inert gas.

Referring to FIG. 14 again, upper source electrode 127 is formed on source electrode 111. Also, drain electrode 112 is formed on the backside surface of silicon carbide substrate 81. Also, gate electrode 110 is formed on oxide film 126. Thus, a semiconductor device 100 is obtained.

A configuration in which the conductivity type is replaced in the present embodiment, i.e. a configuration in which the p type and n type are replaced, can be employed.

The silicon carbide substrate for producing semiconductor device 100 is not limited to silicon carbide substrate 81 of the first embodiment, and a silicon carbide substrate of any of the other embodiments may be employed.

Furthermore, although a vertical type DiMOSFET is taken as an example, another type of semiconductor device may be manufactured using the semiconductor substrate of the present invention. For example, a RESURF-JFET (Reduced Surface Field-Junction Field Effect Transistor), or a Schottky diode may be manufactured.

EXAMPLES

Example 1

For a supporting portion 30 (FIG. 3), a silicon carbide wafer having a diameter of 100 mm, a thickness of 300 μm, 4H polytype, a plane orientation of (03-38), an n type impurity concentration of $1\times10^{20}$ cm$^{-3}$, a micropipe density of $1\times10^4$ cm$^{-2}$, and a stacking fault density of $1\times10^5$ cm$^{-1}$ was prepared.

For each single crystal substrate group 10, a silicon carbide wafer having a square shape of 35×35 mm, a thickness of 300 μm, 4H polytype, a plane orientation of (03-38), an n type impurity concentration of $1\times10^{19}$ cm$^{-3}$, a micropipe density of 0.2 cm$^{-2}$, and a stacking fault density less than 1 cm$^{-1}$ was prepared. This silicon carbide wafer was formed by slicing from a bulk of silicon carbide single crystal. The sliced face was not subjected to polishing. By the slicing, a surface layer 71 having a thickness of approximately 20 μm was produced.

The single crystal substrate group was mounted on first heat body 91 in a matrix. Next, supporting portion 30 was placed on single crystal substrate group 10. Then, second heat body 92 was mounted on supporting portion 30. Accordingly, first heat body 91, single crystal substrate group 10, supporting portion 30, and second heat body 92 constituting a stacked body was prepared.

The stacked body was placed in a heat-insulating container 40 (FIG. 3) made of graphite. Then, nitrogen gas was introduced into heat-insulating container 40 at the flow rate of 100 sccm (standard cubic centimeter per minute), and the pressure in heat-insulating container 40 was controlled to attain 133 Pa.

The temperature in heat-insulating container 40 was raised to approximately 2,000° C. by heater 50. This heating was carried out such that the temperature of first heat body 91 is higher than the temperature of second heat body 92. Thus, the temperature of single crystal substrate group 10 facing first heat body 91 was made higher than the temperature of supporting portion 30 facing second heat body 92. Accordingly, silicon carbide was sublimated from the backside surface of single crystal substrate group 10 (FIG. 5: backside surfaces B1, B2). For the purpose of studying the correlation between the sublimated thickness and the property of the obtained silicon carbide substrate, 0 μm, 2.5 μm, 10 μm, 15 μm, 20 μm, 25 μm and 50 μm were taken as the sublimated thickness.

Then, the temperature gradient between single crystal substrate group 10 and supporting portion 30 was inverted based on the same atmosphere and substantial temperature in heat-insulating container 40. In other words, the temperature of supporting portion 30 was made higher than that of single crystal substrate group 10. Accordingly, single crystal substrate group 10 and supporting portion 30 were connected (FIGS. 7 and 8).

The connecting strength and the micropipe density at the connecting boundary were studied. The results are shown in Table 1 set forth below.

TABLE 1

| Sublimated thickness (μm) | 0 | 2.5 | 5 | 10 | 15 | 20 | 25 | 50 |
|---|---|---|---|---|---|---|---|---|
| Connecting strength (relative value) | 30 | 40 | 50 | 65 | 90 | 100 | 100 | 100 |
| Micropipe density (cm$^{-2}$) | $1\times10^6$ | $5\times10^5$ | 50000 | 1000 | 100 | 10 | 10 | 10 |

It was appreciated from these results that the connecting strength is improved and the micropipe density at the connecting boundary is reduced by removing surface layer 71 (FIG. 5) through sublimation in the present example. It was also appreciated that this effect is saturated when the sublimated thickness arrives at the surface layer thickness of 20 μm.

Example 2

By subjecting backside surface B1 of single crystal substrate 11 (FIG. 9) to molten KOH at the temperature of 500° C. for 10 minutes, a portion corresponding to approximately 10 μm in thickness was removed. Then, a silicon carbide substrate was manufactured using this single crystal substrate (FIG. 11).

Example 3

Backside surface B1 of single crystal substrate 11 (FIG. 9) was removed corresponding to a thickness of approximately 3 μm by means of gas etching using hydrogen gas. The etching conditions were 1500° C. for the temperature, 3 slm (standard liter per minute) for the hydrogen flow rate, and 60 minutes for the duration. Then, a silicon carbide substrate was manufactured using this single crystal substrate 11 (FIG. 11).

Example 4

Backside surface B1 of single crystal substrate 11 (FIG. 9) was removed corresponding to a thickness of approximately 5 μm by means of gas etching using mixture gas of hydrogen and hydrogen chloride. The etching conditions were 1500° C. for the temperature, 3 slm for the hydrogen flow rate, 0.3 slm for the hydrogen chloride flow rate, and 60 minutes for the duration. A silicon carbide substrate was manufactured using this single crystal substrate 11 (FIG. 11).

Example 5

Backside surface B1 of single crystal substrate 11 (FIG. 9) was removed corresponding to a thickness of approximately 5 μm by RIE (Reactive Ion Etching). The etching conditions were 10 sccm for the carbon tetrafluoride ($CF_4$) flow rate, 5 sccm for the oxygen flow rate, 300-500 W for the output, and 20 minutes for the duration. A silicon carbide substrate was manufactured using this single crystal substrate 11 (FIG. 11).

It should be understood that the embodiments and examples disclosed herein are illustrative and non-restrictive in every respect. The scope of the present invention is defined by the terms of the claims, rather than the description set forth above, and is intended to include any modifications within the scope and meaning equivalent to the terms of the claims.

DESCRIPTION OF THE REFERENCE SIGNS 11 single crystal substrate (first single substrate);
12-19, 41 single crystal substrate;
30 supporting portion;
81, 85, 86 silicon carbide substrate;
91 first heat body;
92 second heat body;
100 semiconductor device.

The invention claimed is:

1. A method for manufacturing a silicon carbide substrate, comprising the steps of:
    preparing at least one single crystal substrate, each having a backside surface and made of silicon carbide, and a supporting portion having a main surface and made of silicon carbide, said preparing step including the step of forming at least one of said backside surface and said main surface by machining, and a surface layer having distortion in a crystal structure being formed on at least one of said backside surface and said main surface by said forming step, said method further comprising the steps of:
    removing said surface layer at least partially, and
    connecting said backside surface and said main surface to each other, after said removing step;
    wherein said connecting step is carried out by causing sublimation of silicon carbide from said main surface and recrystallization of silicon carbide on said backside surface, between said backside surface and said main surface.

2. The method for manufacturing a silicon carbide substrate according to claim 1, wherein said removing step is carried out by sublimation of said surface layer.

3. The method for manufacturing a silicon carbide substrate according to claim 2, wherein
    said surface layer is formed at said backside surface in said preparing step,
    said surface layer formed at said backside surface is removed at least partially in said removing step.

4. The method for manufacturing a silicon carbide substrate according to claim 3, wherein said removing step includes the step of arranging said backside surface and said main surface to face each other prior to said sublimation step.

5. The method for manufacturing a silicon carbide substrate according to claim 1, wherein said removing step is carried out by sacrificial oxidation.

6. The method for manufacturing a silicon carbide substrate according to claim 1, wherein said removing step is carried out chemically.

7. The method for manufacturing a silicon carbide substrate according to claim 1, wherein said removing step is carried out such that said surface layer is removed entirely.

8. The method for manufacturing a silicon carbide substrate according to claim 1, wherein said at least one single crystal substrate includes a plurality of single crystal substrates.

9. The method for manufacturing a silicon carbide substrate according to claim 1, wherein said removing step is carried out by etching said surface layer.

10. The method for manufacturing a silicon carbide substrate according to claim 1, wherein said preparing step includes the step of mechanically polishing said backside surface.

11. The method for manufacturing a silicon carbide substrate according to claim 1, wherein said preparing step includes the step of forming said backside surface by slicing.

12. The method for manufacturing a silicon carbide substrate according to claim 1, wherein
    said at least one silicon carbide substrate includes a first single crystal substrate having a first surface opposite to said backside surface,
    said first surface has an off angle greater than or equal to 50° and less than or equal to 65° relative to a {0001} plane.

13. The method for manufacturing a silicon carbide substrate according to claim 12, wherein an angle between an off orientation of said first surface and a <1-100> direction of said first single crystal substrate is less than or equal to 5°.

14. The method for manufacturing a silicon carbide substrate according to claim 13, wherein the off angle of said first surface relative to a {03-38} plane in the <1-100> direction of said first single crystal substrate is greater than or equal to −3° and less than or equal to 5°.

* * * * *